(12) United States Patent
Liu et al.

(10) Patent No.: US 11,259,444 B2
(45) Date of Patent: Feb. 22, 2022

(54) CONNECTOR AND CONNECTOR CAGE WITH ELASTIC CLIP

(71) Applicants: Tyco Electronics (Shanghai) Co. Ltd., Shanghai (CN); TE Connectivity Corporation, Berwyn, PA (US)

(72) Inventors: WenYu Liu, Shanghai (CN); Hongqiang Han, Shanghai (CN); Jiwang Jin, Shanghai (CN); Xinbo Liu, Shanghai (CN); Michael John Phillips, Middletown, PA (US)

(73) Assignees: Tyco Electronics (Shanghai) Co. Ltd., Shanghai (CN); TE Connectivity Corporation, Berwyn, PA (US)

( * ) Notice: Subject to any disclaimer, the term of this patent is extended or adjusted under 35 U.S.C. 154(b) by 23 days.

(21) Appl. No.: 16/438,923

(22) Filed: Jun. 12, 2019

(65) Prior Publication Data

US 2019/0387644 A1 Dec. 19, 2019

(30) Foreign Application Priority Data

Jun. 13, 2018 (CN) .......................... 201810609536.1

(51) Int. Cl.
*H05K 7/20* (2006.01)
*H01R 13/6581* (2011.01)
(Continued)

(52) U.S. Cl.
CPC ....... *H05K 7/20418* (2013.01); *G02B 6/4269* (2013.01); *H01R 13/502* (2013.01);
(Continued)

(58) Field of Classification Search
CPC ............ H05K 7/1401; H05K 7/20154; H05K 7/20418–20454; H05K 1/181; G02B 6/4256–4268; G02B 6/4269; H01R 13/6275; H01R 13/6581–6591; H01R 13/659; H01R 13/6598; H01R 13/665; H01R 13/6596; H01R 12/7005; H01R 12/57; H01R 2201/04; H01R 24/00; H01R 4/48; F28F 3/06; F28F 9/001; H04B 10/40; H02G 3/32
(Continued)

(56) References Cited

U.S. PATENT DOCUMENTS 5,448,449 A * 9/1995 Bright ................. H01L 23/4093
174/16.3
6,081,424 A * 6/2000 Mach ................. H05K 7/20436
165/185
(Continued)

*Primary Examiner* — Zachary Pape
*Assistant Examiner* — Amir A Jalali
(74) *Attorney, Agent, or Firm* — Barley Snyder

(57) ABSTRACT

A connector, comprises: a cage having a chamber having a top wall; a radiator mounted on the top wall of the chamber; an elastic clip fixing the radiator on the top wall of the chamber and having a first side and a second side opposite to the first side in a lateral direction of the chamber; a first latch on the cage and having a slot; a second latch on the cage and having a slot; a first hook on the first side of the elastic clip engaged into the slot of the first latch from an outer side of the first latch; and a second hook on the second side of the elastic clip engaged into the slot of the second latch from an inner side of the second latch far away from the first latch and facing the first latch.

22 Claims, 2 Drawing Sheets

(51) Int. Cl.
*H01R 13/66* (2006.01)
*H01R 13/502* (2006.01)
*H05K 1/18* (2006.01)
*G02B 6/42* (2006.01)
*H01R 13/6594* (2011.01)
*H01L 23/40* (2006.01)

(52) U.S. Cl.
CPC ....... *H01R 13/6581* (2013.01); *H01R 13/665* (2013.01); *H05K 1/181* (2013.01); *H05K 7/2049* (2013.01); *H05K 7/20436* (2013.01); *G02B 6/4261* (2013.01); *H01L 23/4093* (2013.01); *H01R 13/6594* (2013.01)

(58) Field of Classification Search
USPC .......................................... 361/704–712, 818
See application file for complete search history.

(56) References Cited

U.S. PATENT DOCUMENTS

| | | | | |
|---|---|---|---|---|
| 6,449,157 B1 * | 9/2002 | Chu | .................... | H01L 23/4093 165/185 |
| 6,508,300 B1 * | 1/2003 | Hegde | ................. | H01L 23/4093 165/80.3 |
| 6,574,109 B1 * | 6/2003 | McHugh | ............. | H01L 23/4093 165/80.3 |
| 6,986,679 B1 * | 1/2006 | Aronson | ................ | H01R 25/00 439/170 |
| 8,599,559 B1 * | 12/2013 | Morrison | ............. | H05K 9/0058 361/702 |
| 10,575,442 B2 * | 2/2020 | Bucher | ................ | H01R 12/716 |
| 2007/0183128 A1 * | 8/2007 | Pirillis | ............... | H05K 7/20418 361/715 |
| 2010/0157539 A1 * | 6/2010 | Wang | .................. | H01L 23/4093 361/709 |
| 2015/0180168 A1 * | 6/2015 | Han | .................... | H01R 13/6581 439/353 |
| 2015/0340797 A1 * | 11/2015 | Zhou | .................... | H01R 13/516 439/625 |
| 2016/0174415 A1 * | 6/2016 | Ito | ........................ | G02B 6/4269 361/715 |
| 2016/0322757 A1 * | 11/2016 | Liu | ..................... | H01R 13/6583 |
| 2017/0250479 A1 * | 8/2017 | Xie | ..................... | H01R 12/585 |
| 2017/0261674 A1 * | 9/2017 | Henry | ................... | G02B 6/008 |
| 2018/0090863 A1 * | 3/2018 | Yang | ................... | H01R 12/716 |
| 2019/0230817 A1 | 7/2019 | Han et al. | | |
| 2019/0288459 A1 | 9/2019 | Jin et al. | | |

* cited by examiner

CONNECTOR AND CONNECTOR CAGE WITH ELASTIC CLIP

CROSS-REFERENCE TO RELATED APPLICATION

This application claims the benefit of the filing date under 35 U.S.C. § 119(a)-(d) of Chinese Patent Application No. 201810609536.1, filed on Jun. 13, 2018.

FIELD OF THE INVENTION

The present invention relates to a connector and more particularly, to an electrical connector with a radiator.

BACKGROUND

A high speed optoelectronic connector usually includes a cage (or referred to as a steel cage), a radiator mounted on a top wall of the cage, and an elastic clip to hold the radiator on the cage.

The cage commonly has a plurality of chambers arranged side by side, a radiator is installed on the top wall of each chamber and is fixed on the cage by an elastic clip. In this arrangement, the elastic clip comprises a pair of longitudinal beams extending in a longitudinal direction of the cage and a pair of lateral beams connected between the pair of longitudinal beams. A plurality of elastic pressing fingers are formed on each lateral beam. When the elastic clip is fixed on the top wall of the cage, the elastic pressing fingers on the pair of lateral beams, press against both ends of the radiator, in a length direction thereof, so as to fix the radiator on the cage.

In order to avoid the elastic pressing fingers on the elastic clip, a large blank area on the radiator, devoid of any heat dissipation columns or fins is required for the elastic pressing fingers placement. This, in turn, reduces the heat dissipation area and the service life of the connector. In addition, the length of the radiator will be limited by the elastic clip, preventing adaptation to different heat dissipation performance requirements.

In order to increase the effective heat dissipation area, the radiator may be pressed directly and maintained on the top wall of the cage by a pair of elastic beams of an elastic clip. A hook is formed on each side of the elastic clip, and a latch engaged with the hook is formed on the top wall of the cage. When the hook of the elastic clip is locked into the latch of the cage, the radiator is fixed on the top wall of the cage. However, in this arrangement, the hook on each side of the elastic clip needs to be locked into the corresponding latch from an inner side of the latch. Thereby, during pressing the elastic clip downward, the middle part of the elastic clip will be abutted against the radiator, two side parts of the elastic clip will shrink and be deformed inward, and will thereby cause a problem with the hook, such that the hook on each side of the elastic clip cannot be easily locked into the slot of the latch. As a result, it is sometimes necessary to use a special tool to pull the hook outward in order to lock the hook into the slot of the latch, which makes the installation of the elastic clip more difficult, and may damage the thin heat sink of the radiator during pulling the hook.

SUMMARY OF THE INVENTION

A connector, constructed in accordance with the present invention, includes a cage having a chamber having a top wall, a radiator mounted on the top wall of the chamber, and an elastic clip fixing the radiator on the top wall of the chamber and having a first side and a second side opposite to the first side in a lateral direction of the chamber. This connector also includes a first latch on the cage and having a slot and a second latch on the cage and having a slot. This connector further includes a first hook on the first side of the elastic clip engaged into the slot of the first latch from an outer side of the first latch and a second hook on the second side of the elastic clip engaged into the slot of the second latch from an inner side of the second latch far away from the first latch and facing the first latch.

A connector cage, constructed in accordance with the present invention, includes a chamber having a top wall, a radiator on the top wall of the chamber and an elastic clip fixing the radiator on the top wall of the chamber. This connector cage also includes a hook on the elastic clip and a latch on the top wall of the chamber and having a slot and an inclined guide portion on the top of the latch guiding the hook of the elastic clip into the slot in the top wall and fixing the radiator on the top wall of the chamber.

BRIEF DESCRIPTION OF THE DRAWINGS

The invention will now be described by way of examples with reference to the accompanying Figures, of which.

DETAILED DESCRIPTION OF THE EMBODIMENT(S)

Figure 1:
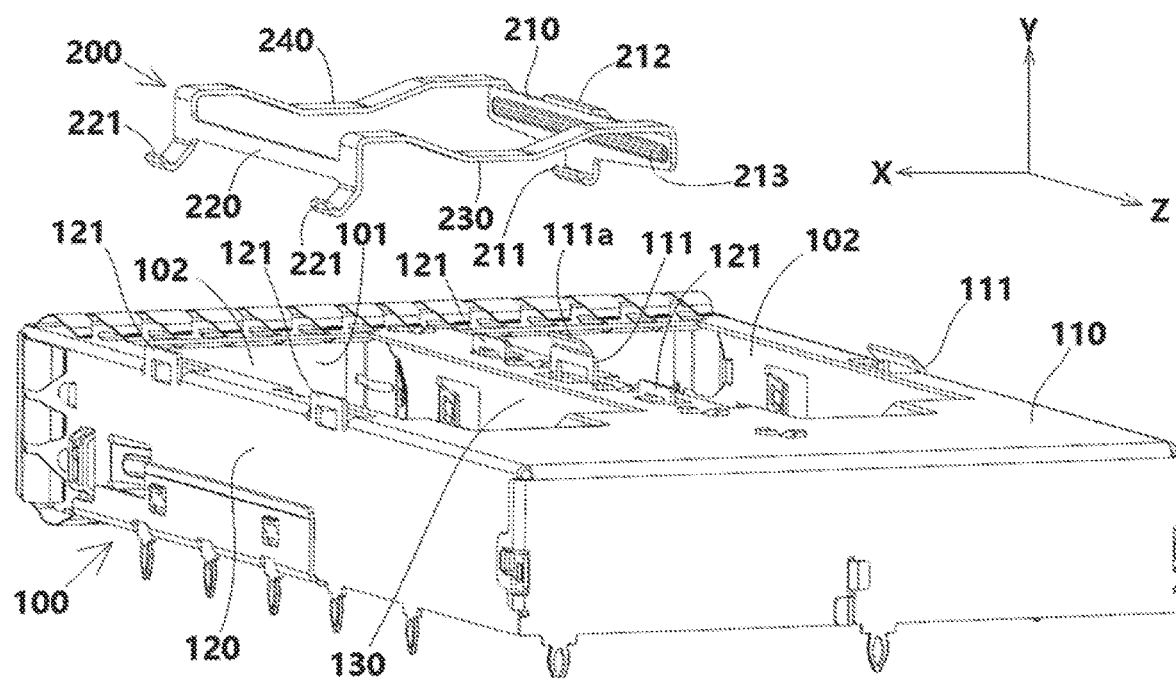
FIG. 1 is a perspective view of a cage and an elastic clip of a connector according to an embodiment of the present invention.

Embodiments of the present invention will be described hereinafter in detail with reference to the attached drawings, wherein the like reference numerals refer to like elements. The present invention may, however, be embodied in many different forms and should not be construed as being limited to the embodiment set forth herein; rather, these embodiments are provided so that the present disclosure will convey the concept of the invention to those skilled in the art.

Figure 2:
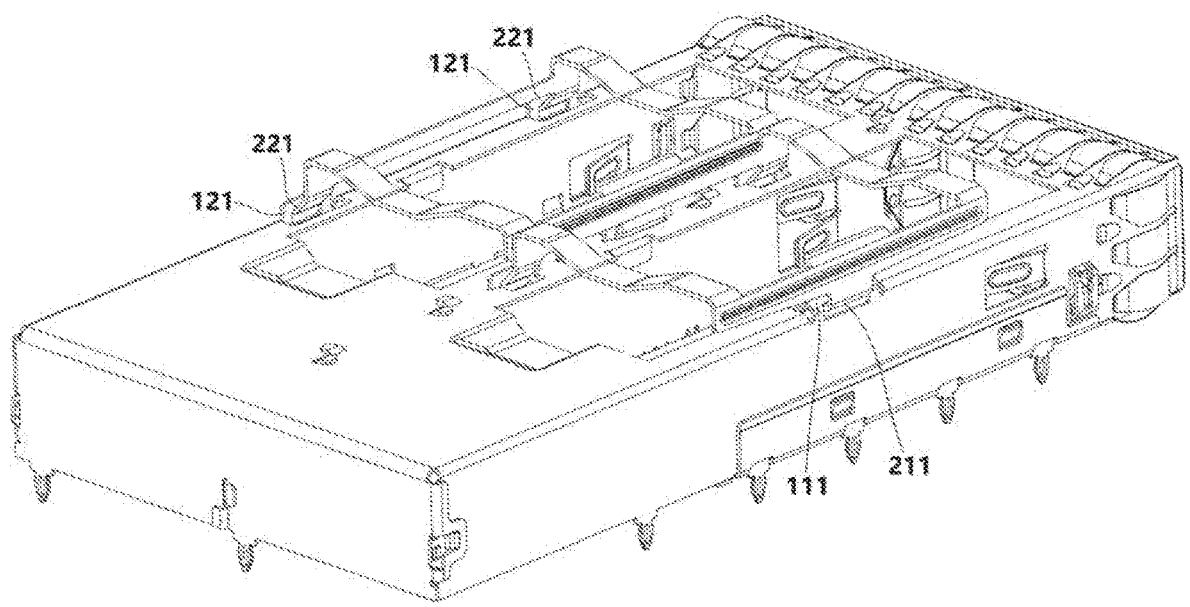
FIG. 2 is a perspective view of a cage and an elastic clip of a connector according to an embodiment.
Figure 3:
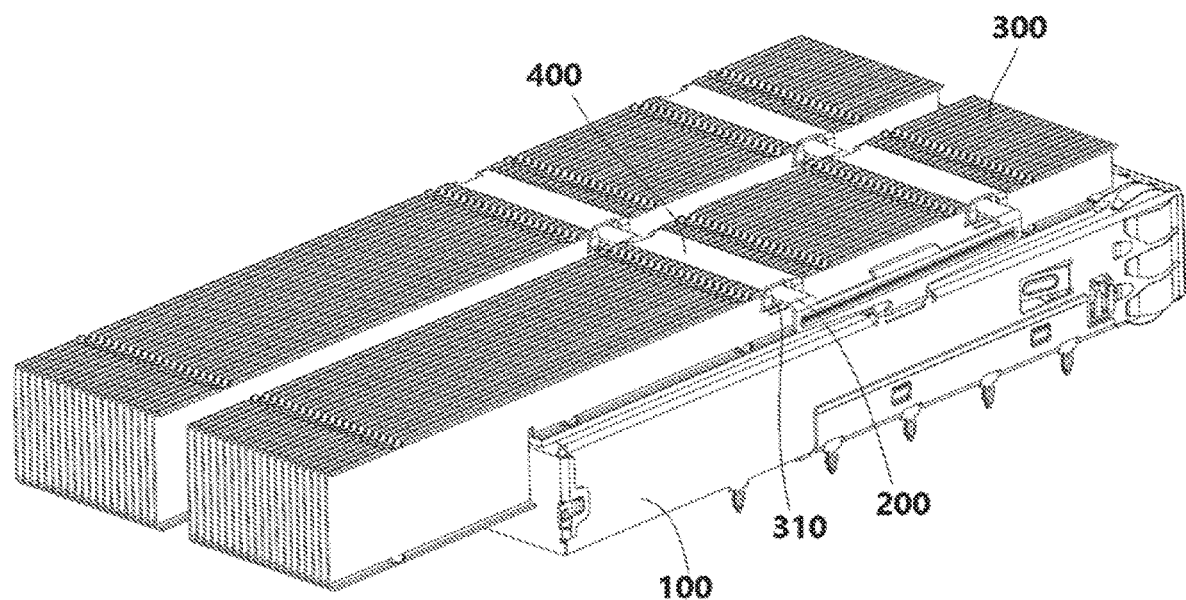
FIG. 3 is a perspective view of an assembled connector according to an embodiment.

A connector, as shown in an embodiment in FIGS. 1-3, comprises a cage 100, at least one radiator 300, and at least one elastic clip 200. The cage 100 has at least one chamber 101. An optical module (not shown) of a mating connector mated with the connector is received in the chamber 101. The at least one radiator 300 is mounted on a top wall of the at least one chamber 101, respectively. The at least one elastic clip 200 is adapted to fix the at least one radiator 300 on the top wall of the at least one chamber 101, respectively.

As further shown in FIGS. 1-3, the elastic clip 200 has a first side and a second side opposite to the first side in a lateral direction X of the chamber 101, a first hook 211 and a second hook 221 are formed on the first side and the second side of the elastic clip 200, respectively. A first latch 111 and a second latch 121 are formed on the cage 100 and engaged with the first hook 211 and the second hook 221, respectively.

The first hook 211, as shown in FIGS. 1-3, is locked into a slot of the first latch 111 from an outer side of the first latch 111, far away from the second latch 121, and the second hook 221 is locked into a slot of the second latch 121 from an inner side of the second latch 121 facing the first latch 111.

A process of mounting the elastic clip 200 on the cage 100, as shown in FIGS. 1-3, mainly comprises the steps of:

S100: locking the second hook 221 into the slot of the second latch 121 from the inner side of the second latch 121 facing the first latch 111;

S200: pressing downward the elastic clip 200, so that the first hook 211 is locked into the slot of the first latch 111 from the outer side of the first latch 111 far away from the second latch 121.

In the above embodiments, the first hook 211 of the elastic clip 200 is locked into a slot of the first latch 111 from an outer side of the first latch 111. Thereby, it is easy to lock the first hook 211 into the slot of the first latch 111, reducing the difficulty of installing the elastic clip 200.

The first latch 111 comprises an inclined guide portion 111a at a top thereof, as shown in FIGS. 1-3. The inclined guide portion 111a is adapted to guide the first hook 211 into the slot of the first latch 111. In this way, it may further reduce the difficulty to install the elastic clip 200.

Each elastic clip 200, as shown in FIGS. 1-3, comprises a pair of longitudinal beams 210, 220. The first hook 211 is formed on a first longitudinal beam 210 of the pair of longitudinal beams 210, 220. The second hook 221 is formed on a second longitudinal beam 220 of the pair of longitudinal beams 210, 220.

Additionally, as shown in FIGS. 1-3, the first longitudinal beam 210 and the second longitudinal beam 220 are located at opposite sides of the radiator 300 in the lateral direction X, respectively.

Likewise, each elastic clip 200, as shown in FIGS. 1-3, further comprise a pair of elastic lateral beams 230, 240 connected between the pair of longitudinal beams 210, 220 and astride the radiator 300 in the lateral direction X, so as to elastically press the radiator 300 on the top wall of the chamber 101.

In an embodiment, as shown in FIGS. 1-3, one first hook 211 is formed on the first longitudinal beam 210 and located at a middle position of the first longitudinal beam 210 in a length direction Z thereof.

As shown in FIGS. 1-3, two second hooks 221 are formed on the second longitudinal beam 220 and located at both ends of the second longitudinal beam 220 in the length direction Z thereof, respectively.

As shown in FIGS. 1-3, at least one strengthening rib 213 protruding inward or outward is formed on the first longitudinal beam 210, and the strengthening rib 213 extends from one end to the other end of the first longitudinal beam 210 in the length direction thereof.

The first longitudinal beam 210, as shown in FIGS. 1-3, and the second longitudinal beam 220 extend in a longitudinal direction Z perpendicular to the lateral direction X.

As shown in FIGS. 1-3, the first hook 211 and the second hook 221 are connected to lower edges of the first longitudinal beam 210 and the second longitudinal beam 220, respectively.

The pair of elastic lateral beams 230, 240 comprise a first elastic lateral beam 230 connected between one end of the first longitudinal beam 210 and the second longitudinal beam 220 and a second elastic lateral beam 240 connected between the other ends of the first longitudinal beam 210 and the second longitudinal beam 220, as shown in FIGS. 1-3.

The first elastic lateral beam 230, as shown in FIGS. 1-3, and the second elastic lateral beams 240 are each configured as a curved elastic beam bent downward.

As shown in FIGS. 1-3, the first elastic lateral beam 230 and the second elastic lateral beam 240 are connected to upper edges of the first longitudinal beam 210 and the second longitudinal beam 220, respectively.

A pressing portion 212 is formed on the first longitudinal beam 210, at a middle position of the first longitudinal beam 210, in the length direction Z thereof and connected to an upper edge of the first longitudinal beam 210, as shown in FIGS. 1-3.

In addition, as shown in FIGS. 1-3, the cage 100 comprises a top wall 110, a bottom wall and a pair of sidewalls 120, the first latch 111 is formed on one of the pair of sidewalls 120, and the second latch 121 is formed on the other of the pair of sidewalls 120.

The cage 100 comprises at least one partition wall 130, as shown in FIGS. 1-3, configured to divide an inner space of the cage 100 into a plurality of chambers 101, and the plurality of chambers 101 are arranged in the lateral direction X side by side.

As shown in FIGS. 1-3, each partition wall 130 is formed with two second latches 121 and one first latch 111 between the two second latches 121. The first latch 111 and the second latch 121 on the partition wall 130 pass through the top wall 110 of the cage 100 and protrude upward from the top wall 110 of the cage 100.

As further shown in FIGS. 1-3, the first hook 211 on one of two adjacent elastic clips 200 is locked into the first latch 111 on the partition wall 130; and the second hook 221 on the other of two adjacent elastic clips 200 is locked into the second latch 121 on the partition wall 130.

As shown in FIGS. 1-3, the first latch 111 and the second latch 121 protrude upward from the top wall 110 of the cage 100 to be easily locked with the first hook 211 and the second hook 221, respectively.

A lateral slot 310 is formed in the radiator 300, as shown in FIGS. 1-3, and passes through the radiator 300 in the lateral direction X and is mated with the elastic lateral beam 230, 240, and the elastic lateral beam 230, 240 is adapted to be received in the lateral slot.

As shown in FIGS. 1-3, the connector further comprises a seal cover 400, mounted on the radiator 300, to partly or completely seal the lateral slot 310 of the radiator 300.

An opening 102 is formed in the top wall of each chamber 101, as shown in FIGS. 1-3, and a bottom of the radiator 300 protrudes into the chamber 101 through the opening 102, so as to keep thermal contact with an optical module inserted into the chamber 101.

According to another aspect of the present invention, there is provided a connector cage 100 comprising at least one chamber 101, a latch 111 is formed on a top wall of the at least one chamber 101, the latch 111 comprises an inclined guide portion 111a at a top thereof, which is adapted to guide a hook 211 of an elastic clip 200 into the slot of the latch 111, so as to fix a radiator 300 on the top wall of the at least one chamber 101.

As shown in FIGS. 1-3, the cage of the connector has two chambers 101 arranged side by side. But, the present disclosure is not limited to this, for example, the cage 100 of the connector may comprise a single chamber, three or more chambers.

Figure 4:
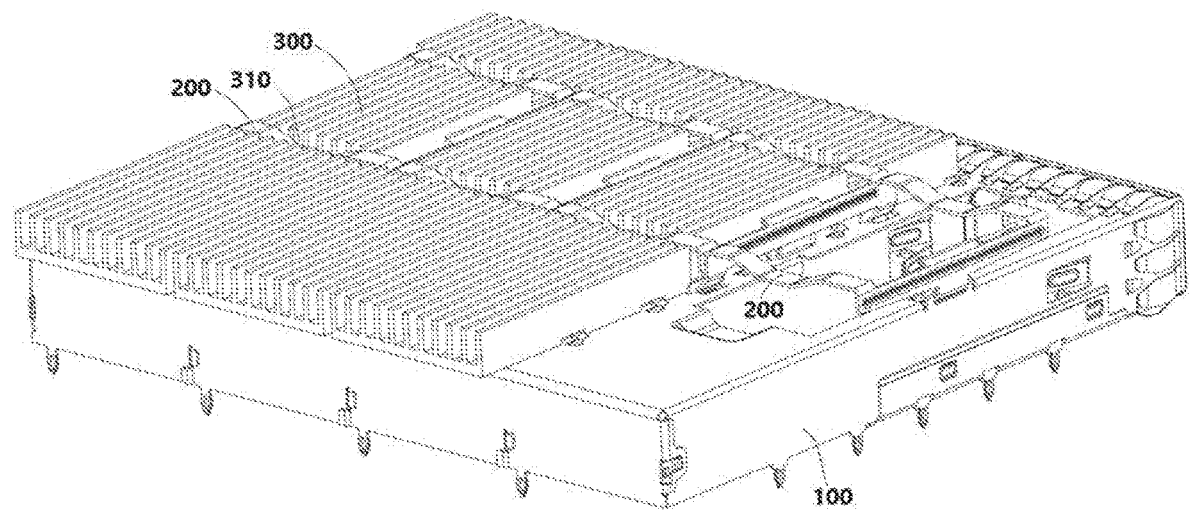
FIG. 4 is a perspective view of a connector according to an embodiment.

As shown in FIG. 4, the cage 100 of the connector comprises four chambers. A radiator 300 is mounted on a top wall of each chamber. Each radiator 300 is fixed and held on the top wall of the chamber 101 by an elastic clip 200.

The embodiments shown in FIG. 4 are essentially the same as those shown in FIGS. 1-3 except for the number of the chambers. Thereby, the descriptions to the features of the embodiments shown in FIG. 4 may refer to the embodiments shown in FIGS. 1-3.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present disclosure are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A connector, comprising:
   a cage having a chamber having a top wall;
   a radiator mounted on the top wall of the chamber;
   an elastic clip fixing the radiator on the top wall of the chamber and having a first side and a second side opposite to the first side in a lateral direction of the chamber;
   a first latch protruding upwardly from the top wall of the cage and having a slot arranged above the top wall and defining an opening formed through the first latch in the lateral direction of the chamber;
   a second latch protruding upwardly from the top wall of the cage and having a slot arranged above the top wall and defining an opening formed through the second latch in the lateral direction of the chamber;
   a first hook on the first side of the elastic clip having a curved free end extending in a direction toward the second side of the elastic clip and engaged into and passing through the opening of the slot of the first latch from an outer side of the first latch in a direction toward the second side of the elastic clip; and
   a second hook on the second side of the elastic clip engaged into the opening of the slot of the second latch from an inner side of the second latch facing the first latch, a curved free end of the second hook extends in the same direction as the curved free end of the first hook.

2. The connector according to claim 1, wherein the first latch is inclined in a direction toward the second latch for defining an inclined guide portion that guides the free end of the first hook into the slot of the first latch.

3. The connector according to claim 1, wherein the elastic clip comprises:
   a first longitudinal beam having the first hook connected to a lower edge of the first longitudinal beam at a middle position along a length direction thereof, the first longitudinal beam oriented generally vertically and comprising a planar side opposing a first side of the radiator;
   a second longitudinal beam having a plurality of second hooks connected to lower edges thereof, with one second hook arranged at each end of the second longitudinal beam in the length direction, the second longitudinal beam oriented generally vertically and comprising a planar side opposing a second side of the radiator;
   a first elastic lateral beam bent downwardly and connected between one end of the first longitudinal beam and the second longitudinal beam; and
   a second elastic lateral beam bent downwardly and connected between the other ends of the first longitudinal beam and the second longitudinal beam, the first and second elastic lateral beams connected to an upper edge of the first longitudinal beam opposite the lower edge, and an upper edge of the second longitudinal beam opposite the lower edge, respectively, and arranged laterally across the radiator so as to elastically press the radiator on the top wall of the chamber.

4. The connector according to claim 1, wherein:
   the first latch comprises two first latches, one of the first latches arranged on a first sidewall of the cage and the other one of the first latches arranged on a partitioning wall of the cage, the partitioning wall dividing an inner space of the chamber; and
   the second latch comprises two second latches, one of the second latches arranged on the partitioning wall and the other one of the second latches arranged on a second sidewall of the cage, opposite the first sidewall, the elastic clip engaged with one of the first latches and one of the second latches.

5. The connector according to claim 4, wherein the one of the second latches arranged on the partitioning wall comprises a pair of second latches arranged on the partitioning wall, the other one of the first latches arranged between the pair of second latches on the partitioning wall.

6. A connector, comprising:
   a cage having a chamber having a top wall and a pair of sidewalls;
   a radiator mounted on the top wall of the chamber;
   an elastic clip fixing the radiator on the top wall of the chamber and having a first side and a second side opposite to the first side in a lateral direction of the chamber;
   a first latch on one of the pair of sidewalls of the cage and having a slot;
   a second latch on the other of the pair of sidewalls of the cage and having a slot;
   a first hook on the first side of the elastic clip engaged into the slot of the first latch from an outer side of the first latch; and
   a second hook on the second side of the elastic clip engaged into the slot of the second latch from an inner side of the second latch far away from the first latch and facing the first latch, wherein:
   (a) the cage comprises a partition wall dividing an inner space of the cage into a plurality of chambers, which are arranged in the lateral direction side by side, and
   (b) the connector has two second latches on the partition wall with the first latch between the two second latches.

7. The connector according to claim 6, further comprising:
   (a) a first longitudinal beam on the elastic clip and having the first hook, the first longitudinal beam oriented generally vertically and comprising a planar side opposing a first side of the radiator, and (b) a second longitudinal beam on the elastic clip and having the second hook, the second longitudinal beam oriented generally vertically and comprising a planar side opposing a second side of the radiator.

8. The connector according to claim 7, wherein the first longitudinal beam and the second longitudinal beam are at opposite sides of the radiator in the lateral direction.

9. The connector according to claim 8, wherein the elastic clip further comprises a pair of elastic lateral beams connected between the pair of longitudinal beams and astride the radiator in the lateral direction, so as to elastically press the radiator on the top wall of the chamber.

10. The connector according to claim 9, wherein the pair of elastic lateral beams comprises a first elastic lateral beam connected between one end of the first longitudinal beam and the second longitudinal beam, and a second elastic lateral beam connected between the other ends of the first longitudinal beam and the second longitudinal beam.

11. The connector according to claim 10, wherein the first elastic lateral beam and the second elastic lateral beam each are a curved elastic beam bent downward.

12. The connector according to claim 11, wherein the first elastic lateral beam and the second elastic lateral beam are connected to an upper edge of the first longitudinal beam opposite the lower edge, and an upper edge of the second longitudinal beam opposite the lower edge, respectively.

13. The connector according to claim 9, wherein the radiator has a lateral slot which passes in the lateral direction through the radiator and corresponds to the elastic lateral beam, and the elastic lateral beam is received in the lateral slot.

14. The connector according to claim 7, wherein:
(a) the first hook is on the first longitudinal beam at a middle position of the first longitudinal beam in a length direction thereof, and
(b) the connector has a plurality of second hooks on the second longitudinal beam with one second hook at each end of the second longitudinal beam in the length direction.

15. The connector according to claim 14, wherein:
(a) the connector further includes a strengthening rib on the first longitudinal beam and protruding inwardly or outwardly from the planar side of the first longitudinal beam, and
(b) the strengthening rib extends from one end of the first longitudinal beam to the other end in the length direction.

16. The connector according to claim 7, wherein the first longitudinal beam and the second longitudinal beam extend in a longitudinal direction perpendicular to the lateral direction.

17. The connector according to claim 7, wherein the first hook is connected to a lower edge of the first longitudinal beam and the second hook is connected to lower edges of the second longitudinal beam.

18. The connector according to claim 7, wherein the first longitudinal beam has a pressing portion at a middle position of the first longitudinal beam in a length direction thereof and is connected to an upper edge of the first longitudinal beam.

19. The connector according to claim 6, wherein the connector has a second elastic clip adjacent the first elastic clip and the first hook on one of two adjacent elastic clips is locked into the first latch on the partition wall and the second hook, on the other of two adjacent elastic clips, is locked into the second latch on the partition wall.

20. The connector according to claim 6, wherein the first latch and the second latch protrude upward from the top wall of the cage.

21. A connector cage, comprising:
a chamber having a top wall, a pair of sidewalls and a partitioning wall dividing an inner space of the chamber into a plurality of chambers arranged side by side in a lateral direction;
a radiator on the top wall of the chamber;
an elastic clip fixing the radiator on the top wall of the chamber;
a first hook and a pair of second hooks on the elastic clip; and
a first latch on one of the pair of sidewalls of the chamber and having a slot and an inclined guide portion on the top of the latch guiding the first hook of the elastic clip into the slot in the top wall and fixing the radiator on the top wall of the chamber;
a pair of second latches on the partitioning wall of the cage, each of the second latches having a slot for receiving one of the pair of second hooks of the elastic clip, the first latch between the two second latches.

22. The connector cage according to claim 21, further comprising a seal cover mounted on the radiator and fitted between opposing walls of a lateral slot defined in the radiator to seal a lateral slot of the radiator.

\* \* \* \* \*